US006597812B1

(12) United States Patent
Fallon et al.

(10) Patent No.: US 6,597,812 B1
(45) Date of Patent: Jul. 22, 2003

(54) SYSTEM AND METHOD FOR LOSSLESS DATA COMPRESSION AND DECOMPRESSION

(75) Inventors: James J. Fallon, Armonk, NY (US); Steven L. Bo, Bayside, NY (US)

(73) Assignee: Realtime Data, LLC, New York, NY (US)

( * ) Notice: Subject to any disclaimer, the term of this patent is extended or adjusted under 35 U.S.C. 154(b) by 0 days.

(21) Appl. No.: 09/579,221

(22) Filed: May 26, 2000

Related U.S. Application Data

(60) Provisional application No. 60/136,561, filed on May 28, 1999.

(51) Int. Cl.[7] .................................................. G06K 9/36
(52) U.S. Cl. ......................... 382/232; 382/245; 341/51
(58) Field of Search ................................ 382/232–251; 341/51–79; 348/420.11–424.2; 375/240–241

(56) References Cited

U.S. PATENT DOCUMENTS

| | | | | |
|---|---|---|---|---|
| 5,870,036 A | * | 2/1999 | Franaszek et al. | 341/51 |
| 5,883,975 A | * | 3/1999 | Narita et al. | 382/232 |
| 5,955,976 A | * | 9/1999 | Heath | 341/87 |
| 6,195,024 B1 | * | 2/2001 | Fallon | 341/51 |
| 6,489,902 B2 | * | 12/2002 | Heath | 341/87 |

* cited by examiner

Primary Examiner—Jingge Wu
(74) Attorney, Agent, or Firm—F. Chau & Associates, LLP; Frank V. DeRosa, Esq.

(57) ABSTRACT

Systems and methods for providing lossless data compression and decompression are disclosed which exploit various characteristics of run-length encoding, parametric dictionary encoding, and bit packing to comprise an encoding/decoding process having an efficiency that is suitable for use in real-time lossless data compression and decompression applications. In one aspect, a method for compressing input data comprising a plurality of data blocks comprises the steps of: detecting if the input data comprises a run-length sequence of data blocks; outputting an encoded run-length sequence, if a run-length sequence of data blocks is detected; maintaining a dictionary comprising a plurality of code words, wherein each code word in the dictionary is associated with a unique data block string; building a data block string from at least one data block in the input data that is not part of a run-length sequence; searching for a code word in the dictionary having a unique data block string associated therewith that matches the built data block string; and outputting the code word representing the built data block string.

30 Claims, 6 Drawing Sheets

SYSTEM AND METHOD FOR LOSSLESS DATA COMPRESSION AND DECOMPRESSION

CROSS-REFERENCE TO RELATED APPLICATION

This application is based on provisional application U.S. Application Ser. No. 60/136,561 filed on May 28, 1999.

BACKGROUND

1. Technical Field

The present invention relates generally to data compression and decompression and, more particularly to systems and methods for providing lossless data compression and decompression using a combination of dictionary and run length encoding.

2. Description of Related Art

Information may be represented in a variety of manners. Discrete information such as text and numbers are easily represented in digital data. This type of data representation is known as symbolic digital data. Symbolic digital data is thus an absolute representation of data such as a letter, figure, character, mark, machine code, or drawing.

Continuous information such as speech, music, audio, images and video frequently exists in the natural world as analog information. As is well-known to those skilled in the art, recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

There are many advantages associated with digital data representation. For instance, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, retrieval and transmittal. This is especially true for diffuse data where continuing increases in fidelity and resolution create exponentially greater quantities of data. Within the current art, data compression is widely used to reduce the amount of data required to process, transmit, store and/or retrieve a given quantity of information. In general, there are two types of data compression techniques that may be utilized either separately or jointly to encode and decode data: lossy and lossless data compression.

Lossy data compression techniques provide for an inexact representation of the original uncompressed data such that the decoded (or reconstructed) data differs from the original unencoded/uncompressed data. Lossy data compression is also known as irreversible or noisy compression. Negentropy is defined as the quantity of information in a given set of data. Thus, one obvious advantage of lossy data compression is that the compression ratios can be larger than that dictated by the negentropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio of the target display device.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the negentropy of a given data set.

It is well known within the current art that data compression provides several unique benefits. First, data compression can reduce the time to transmit data by more efficiently utilizing low bandwidth data links. Second, data compression economizes on data storage and allows more information to be stored for a fixed memory size by representing information more efficiently.

A rich and highly diverse set of lossless data compression and decompression algorithms exist within the current art. These range from the simplest "adhoc" approaches to highly sophisticated formalized techniques that span the sciences of information theory, statistics, and artificial intelligence. One fundamental problem with almost all modern approaches is the compression ratio verses the encoding and decoding speed achieved. As previously stated, the current theoretical limit for data compression is the entropy limit of the data set to be encoded. However, in practice, many factors actually limit the compression ratio achieved. Most modern compression algorithms are highly content dependent. Content dependency exceeds the actual statistics of individual elements and often includes a variety of other factors including their spatial location within the data set.

Within the current art there also presently exists a strong inverse relationship between achieving the maximum (current) theoretical compression ratio, referred to as "algorithmic effectiveness", and requisite processing time. For a given single algorithm the "effectiveness" over a broad class of data sets including text, graphics, databases, and executable object code is highly dependent upon the processing effort applied. Given a baseline data set, processor operating speed and target architecture, along with its associated supporting memory and peripheral set, "algorithmic efficiency" is defined herein as the time required to achieve a given compression ratio. Algorithmic efficiency assumes that a given algorithm is implemented in an optimum object code representation executing from the optimum places in memory. This is virtually never achieved in practice due to limitations within modern optimizing software compilers. In addition, an optimum algorithmic implementation for a given input data set may not be optimum for a different data set. Much work remains in developing a comprehensive set of metrics for measuring data compression algorithmic performance, however for present purposes the previously defined terms of algorithmic effectiveness and efficiency should suffice.

Of the most widely utilized compression techniques, arithmetic coding possesses the highest degree of algorithmic effectiveness but, as expected, is the slowest to execute. This is followed in turn by dictionary compression, Huffman coding, and run-length coding techniques with respectively decreasing execution times. What is not apparent from these algorithms, that is also one major deficiency within the current art, is knowledge of their algorithmic efficiency. More specifically, given a compression ratio that is within the effectiveness of multiple algorithms, the question arises as to their corresponding efficiency on various data sets.

SUMMARY OF THE INVENTION

The present invention is directed to systems and methods for providing lossless data compression and decompression. The present invention exploits various characteristics of run-length encoding, parametric dictionary encoding, and bit packing to comprise an encoding/decoding process having an efficiency that is suitable for use in real-time lossless data compression and decompression applications.

In one aspect of the present invention, a method for compressing input data comprising a plurality of data blocks comprises the steps of:

- detecting if the input data comprises a run-length sequence of data blocks;
- outputting an encoded run-length sequence, if a run-length sequence of data blocks is detected;
- maintaining a dictionary comprising a plurality of code words, wherein each code word in the dictionary is associated with a unique data block string;
- building a data block string from at least one data block in the input data that is not part of a run-length sequence;
- searching for a code word in the dictionary having a unique data block string associated therewith that matches the built data block string; and
- outputting the code word representing the built data block string.

In another aspect of the present invention, the dictionary is dynamically maintained and updated during the encoding process by generating a new code word corresponding to a built data block string, if the built data block string does not match a unique data block string in the dictionary, and then adding the new code word in the dictionary.

In yet another aspect of the present invention, the dictionary is initialized during the encoding process if the number of code words (e.g., dictionary indices) in the dictionary exceeds a predetermined threshold. When the dictionary is initialized, a code word is output in the encoded data stream to indicate that the dictionary has been initialized at that point in the encoding process. An initialization process further comprises resetting the dictionary to only include each possible code word corresponding to a unique data block string comprising a single data block. By way of example, if each data block comprises a byte of data, there will be 256 possible code words for a data block string comprising a single byte. In this instance, the dictionary reset to its initial state will comprise 256 entries.

In another aspect of the present invention, the dictionary further comprises a plurality of control code words, wherein a control code word is designated to represent a dictionary initialization, a run-length encoded sequence, and the end of the input data (or completion of the encoding process). These control words are used in the decoding process to re-create the input data.

In yet another aspect of the present invention, a bit-packing process is employed to pack the bits of successive output code words representing encoded run-length sequences and data block strings.

In another aspect of the present invention, a method for decompressing an encoded data stream comprising a plurality of code words, which is generated using the encoding method, comprises the steps of:

- maintaining a dictionary comprising a plurality of code words utilized to generate the encoded data stream, wherein the code words in the dictionary comprise control code words and code words that are each associated with a unique data block string;
- decoding and outputting a run-length sequence of data blocks associated with an input code word of the encoded data stream, if the input code word is a control code word in the dictionary that indicates an encoded run-length sequence;
- outputting a unique data block string in the dictionary that is associated with an input code word of the encoded data stream, if the input code word is found in the dictionary; and
- if the input code word is not found in the dictionary, building a new data block string comprising (1) the unique data block string associated with a previous control word found in the dictionary and (2) the first data block of the unique data block string, adding the new string to the dictionary, and outputting the new string.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

The present invention is directed to systems and methods for providing lossless data compression and decompression. It is to be understood that the present invention may be implemented in various forms of hardware, software, firmware, or a combination thereof. In particular, the present invention may be implemented in hardware comprising general purpose microprocessors, digital signal processors, and/or dedicated finite state machines. Preferably, the present invention is implemented as an application program, tangibly embodied on one or more data storage mediums, which is executable on any machine, device or platform comprising suitable architecture. It is to be further understood that, because the present invention is preferably implemented as software, the actual system configurations and process flow illustrated in the accompanying Figures may differ depending upon the manner in which the invention is programmed. Given the teachings herein, one of ordinary skill in the related art will be able to contemplate these and similar implementations or configurations of the present invention.

Data Compression

Figure 1:
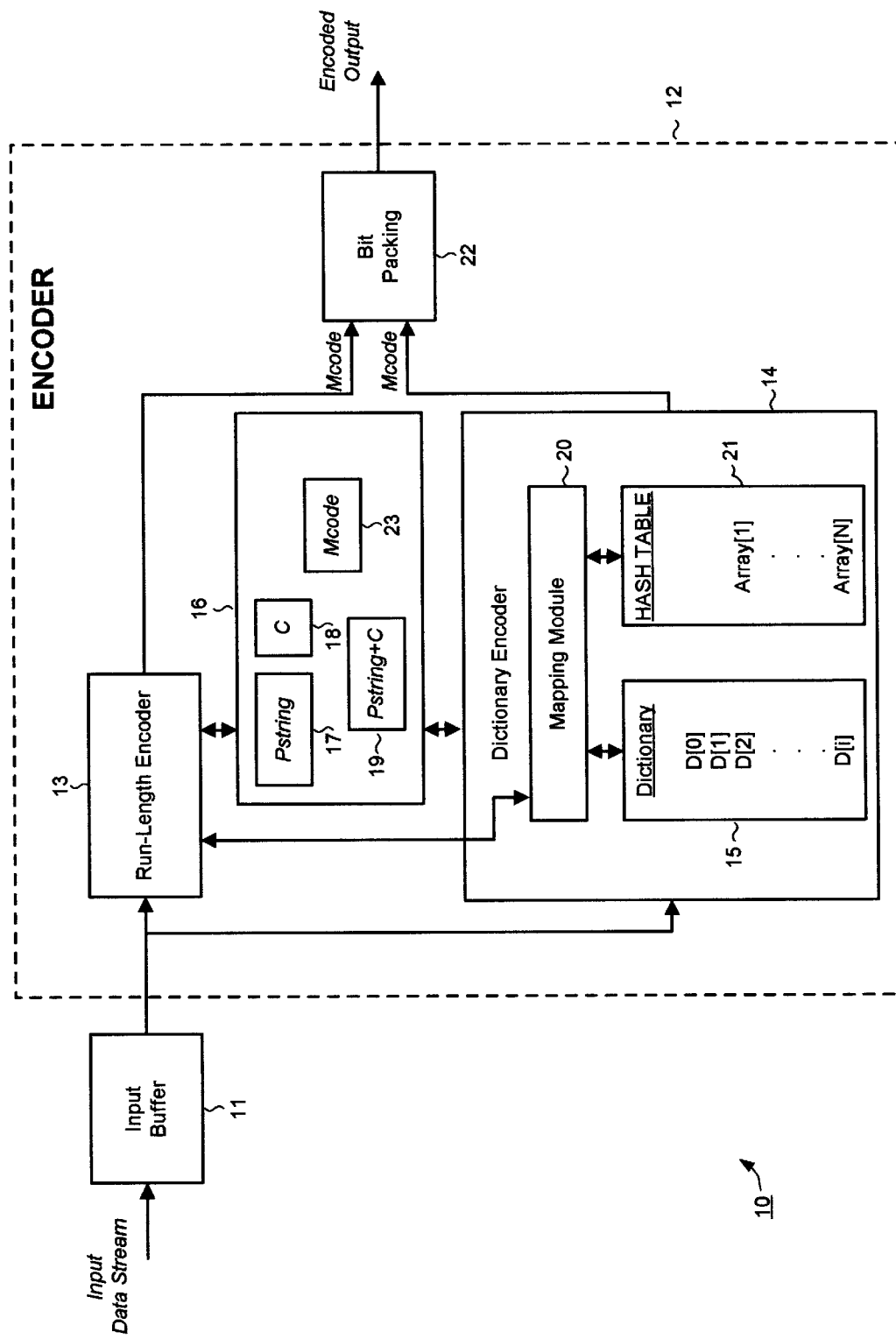
FIG. 1 is a block diagram of a system for providing lossless data compression according to an embodiment of the present invention.

Referring now to FIG. 1, a block diagram illustrates a system 10 for providing lossless data compression according to an embodiment of the present invention. In general, the data compression system 10 comprises an input buffer 11 for temporarily buffering an input data stream and an encoder 12 for compressing the input data stream. It is to be understood that the compressed data stream output from the encoder may, for example, be stored in a storage medium for subsequent retrieval and decoded using a decompression method described below, or transmitted over a local or global computer network (for purposes of increased bandwidth transmission) and decompressed at a desired location. It is to be further understood that the input buffer 11 is an optional component that may be employed, for example, in real-time compression applications where the rate of compression of the encoder 12 is slower than the bandwidth of the input data stream.

In general, the encoder 12 employs a unique combination of compression techniques preferably including run-length encoding and hash table dictionary encoding to compress an input data stream, as well as bit-packing to increase the final compression ratio. More specifically, the encoder 12 comprises a run-length encoder 13 and dictionary encoder 14, both of which utilize a code word dictionary 15 to output one or more "code words" representing a "character string" identified by the respective encoder 13, 14 in the input data stream. It is to be understood that the term "character" as used herein refers to an input byte of data that can take on any one of 256 values, and the term "string" as used herein refers to a grouping of one or more characters (bytes). Furthermore, as described in further detail below, in a preferred embodiment, a "code word" for a given character string comprises a dictionary index (denoted herein as D[i]) of the character string in the dictionary 15.

During an encoding process in which bytes of data in the input stream are input to the encoder 12, the run-length encoder 13 will identify a run-length sequence in the data stream, i.e., a character string comprising a plurality of consecutively similar characters (bytes), and output one or more code words from the dictionary 15 to represent the run-length sequence (as explained in detail below). Moreover, the dictionary encoder 14 will build a character string comprising two or more characters (which does not comprise a run-length sequence), search the dictionary 15 for a code word that corresponds to the character string, and then output the code word representing the character string. In addition, if the character string that is built by the dictionary encoder 14 does not match a character string in the dictionary 15, the dictionary encoder 14 will cause the character string to be added to the dictionary and a new code word (e.g., dictionary index) will be associated with that string. An encoding process according to one aspect of the present invention will be described in detail below with reference, for example, to the flow diagram of FIGS. 2A and 2B.

The encoder 12 utilizes a plurality of data storage structures 16 for temporarily storing data during an encoding process. For example, in the illustrative embodiment of FIG. 1, a Pstring data structure 17 is employed for temporarily storing a working character string, Pstring. A C data structure 18 is employed for temporarily storing a next character (byte) C in the input stream. In addition, a Pstring+C data structure 19 is used for temporarily storing a character string Pstring+C which is a string comprising all of the characters in Pstring plus the character in C. Moreover, an Mcode data structure 23 is used for temporarily storing a code word (Mcode) (e.g., dictionary index) corresponding to a previous successful string match in the dictionary. The use of these data structures will be discussed in further detail below.

The code word dictionary 15 comprises a plurality of dictionary indices D[i], wherein each index in the dictionary 15 is mapped (via a mapping module 20) to either a predefined control code or a different code word corresponding to a character (byte) string. The mapping module 20 preferably employs a hash function to, inter alia, map each character string (e.g., strings of one or more bytes) into a unique index D[i] in the dictionary 15 (although other mapping techniques known to those skilled in the art may be employed). As indicated above, in a preferred embodiment, the dictionary indices D[i] are output as the "code words" (also referred to herein as "Mcodes")by the encoder to create an encoded file. These code words are processed by a decoder to decompress an encoded file (as discussed below with reference to FIGS. 3, 4a and 4b.)

In a preferred embodiment, the first three entries in the dictionary 15, indices D[0], D[1], and D[3], are reserved as control codes. In particular, the entry for the dictionary index D[0], or code word "0", is output to indicate (to the decoder) that the dictionary 15 has been reset to its initial state. As explained in detail below, the dictionary 15 is preferably reset at the commencement of an encoding process before a new input stream is processed and, preferably, during an encoding process when the total number of entries D[i] in the dictionary 15 exceeds a predetermined limit. In addition, the dictionary index D[1], or code word "1", is utilized for the run-length encoding process. More specifically, the code word "1" is output to indicate that the next two consecutive output numbers (in the encoded sequence) represent a run-length encoding sequence comprising (1) a character code and (2) a number denoting the amount of consecutive characters found in the data stream corresponding to the character code. Furthermore, the dictionary index D[2], or code word "2" is output to indicate the end of the data stream and completion of the encoding process.

The next 256 entries in the dictionary 15 (i.e., index numbers 3 through 258) each comprise a single character sting (e.g., one byte) corresponding to one of the 256 possible character codes. Accordingly, in a preferred embodiment, the dictionary indices D[0] through D[258] are the only entries that exist in the dictionary 15 upon initialization of the dictionary 15. Any additional character strings that are dynamically added to the dictionary 15 by the dictionary encoder 14 during an encoding process will be consecutively added beginning at index D[260].

It is to be appreciated that, as indicated above, for a given character string under consideration, the encoder 12 will output (as a code word) the dictionary index number D[i] corresponding to a matching character string. Since the dictionary index number is usually less than two bytes and the input character strings are typically longer than six bytes, the reduction in the number of bits output can be significant.

In one embodiment of the present invention, the dictionary encoder 14 can search the code word dictionary 15 for a matching character string therein by comparing each entry in the dictionary 15 to the input character string under consideration. In certain instances, however, the amount of entries D[i]0 in the dictionary 15 can increase significantly, potentially rendering this search process slow, inefficient and computationally intensive. Accordingly, the data compression system 10 preferably comprises a hash table 21 which is utilized by the dictionary encoder 14 during an encoding process to reduce the search time for finding a matching character string in the dictionary 15.

More specifically, in one embodiment, the hash table 21 comprises a plurality of arrays Array[N], wherein each array comprises every dictionary index number D[i] in the dictionary 15 having an entry (i.e., character strings) that begins with a character code corresponding to the array index. For example, the third hash table array Arrary[3] comprises all the dictionary indices D[i] having a dictionary entry in which the first character (byte) of the string has decimal value of "three." In the preferred embodiment where the encoder processes individual bytes of data in the input stream, since there are 256 possible characters, there are 256 arrays, i.e., Array[N], where N=1 . . . 256. Advantageously, the use of the hash table 21 for finding matching strings in the dictionary reduces the number of string comparisons by 256.

In another embodiment, the hash table 21 comprises a plurality of nested hash tables. For example, a first level of hashing can use the first character to subdivide the dictionary 15 into 256 sub-dictionaries and a second level of hashing may use the $2^{nd}$ character of the input string to further subdivide each of the initial 256 entries. Each additional level of hashing subdivides each dictionary into an additional 256 sub-dictionaries. For example, 2 levels of hashing yields $256^2$ sub-dictionaries and n levels yields $256^n$ sub-dictionaries. The purpose of this hashing function is to reduce the time for searching the dictionary 15. For example, using an n level hashing scheme reduces the search time by $256^n-(n*256)$.

Furthermore, as explained in detail below with reference to the process depicted in FIGS. 2a and 2b, the hash table is dynamically modified to incorporate new entries D[i] that are added to the dictionary 15 during the encoding process.

In addition, the data compression system 10 optionally comprises a bit packing module 22 for providing additional compression of the encoded data stream. As explained above, the maximum size (i.e., number of entries D[i]) of the dictionary 15 is predefined and, consequently, the maximum number of bits of information needed to represent any index in the dictionary 15 is known a priori. For example, if the maximum dictionary size is 4000 entries, only 12 bits are needed to represent any index number. Since data is typically transferred in groups of 8 or 16 bits, in the above example where 12 bits maximum are need to represent the index number, 4 bits out of every 16 bits would be wasted.

Accordingly, to provide additional compression, the encoder 12 preferably implements the bit-packing module 22 to pack the bits of successive output code words. It is to be understood that any suitable bit-packing technique known to those skilled in the art may be employed. In a preferred embodiment, the bit-packing module employs a shift register to output at least 16 bits of data when the data is ready for output. By way of example, assume a 12-bit code word is initially input to the shift register. The next 12-bit code word that is output is also placed in the shift register, and the shift register would contain 24 bits of information. Then, 16 bits would be output from the shift register, leaving 8 bits remaining. When the next 12-bit code word is input to the shift register, the shift register will contain 20 bits, and 16 will be output. This bit packing process is repeated for every output code word until the encoding process is complete.

Advantageously, the bit packing process according to the present invention improves the compression by a factor of 16/12, or 1.33. Moreover, it is to be appreciated that the processing time required for the bit-packing is negligible. Consequently, the bit packing process provides increased compression ("algorithmic effectiveness") without a significant increase in processing overhead ("algorithmic efficiency").

Figure 2A:
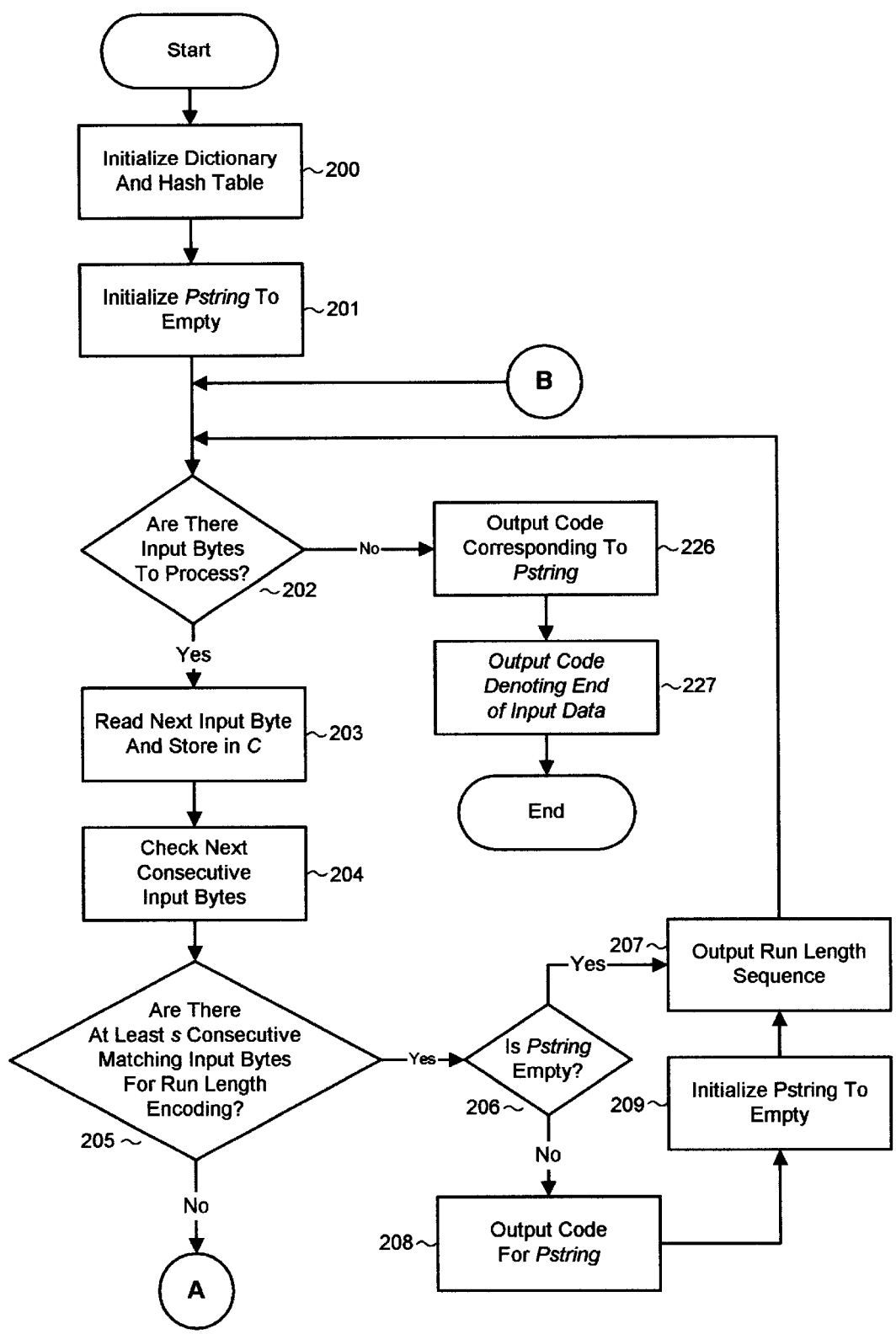
FIGS. 2a and 2b comprise a flow diagram of a method for providing lossless data compression according to one aspect of the present invention.
Figure 2B:
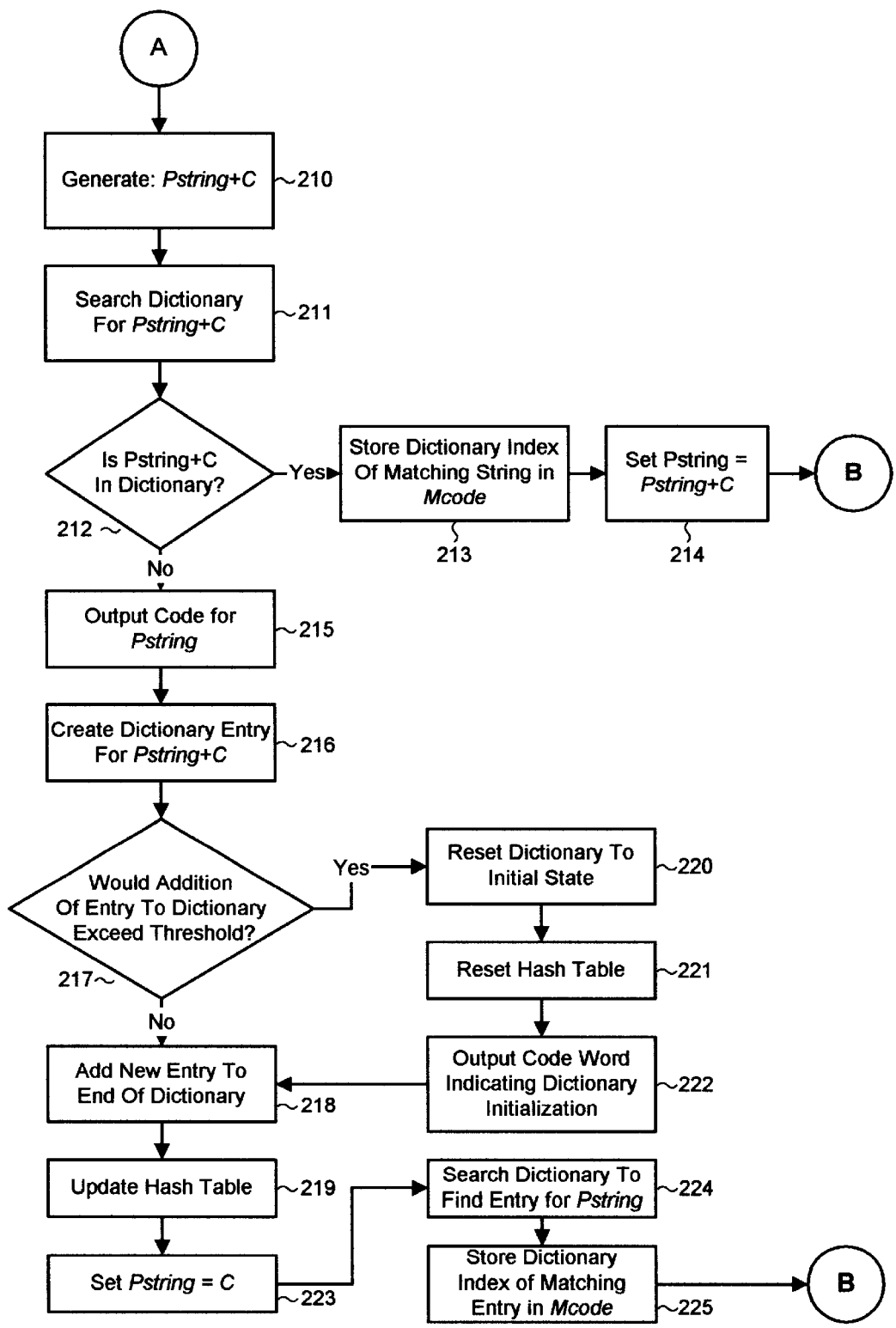

Referring now to FIGS. 2a and 2b, a flow diagram illustrates a method for compressing data according to one aspect of the present invention. In particular, the encoding process depicted in FIGS. 2a and 2b illustrates a mode of operation of the system 10 of FIG. 1. Initially, the dictionary 15 and hash table 21 are initialized (step 200). For example, as noted above, the dictionary 15 is initialized to include 259 entries, i.e., the first three entries D[0]–D[2] comprise the control codes and the next 256 entries D[3]–D[259] comprise the 256 possible character codes (assuming, of course, that the encoder processes data blocks each comprising a byte). Furthermore, the hash table will be initialized such that each array Arrary[1]–[N] comprises one entry—the dictionary index D[i] for the corresponding character code. Next, the Pstring data structure 17 (or "Pstring")is initialized to be empty (i.e., it contains no characters at initialization) (step 201). It is to be understood that neither the C data structure 18 (or "C") nor the Mcode data structure 23 (or "Mcode") require initialization.

After the initialization process, a determination is made as to whether there are any input characters for processing (step 202). If there is input data (affirmative result in step 202), the first (or next) character (e.g., byte) in the input stream will be read and temporarily stored in C (step 203). Then, the next consecutive characters in the input stream are checked (step 204) to determine if there is a string of at least s consecutive characters that match the character stored in C to trigger a run-length sequence (step 205), where s is a predetermined minimum number of consecutive characters that are required to trigger a run-length encoding sequence.

If there are at least s consecutively similar characters in the input stream (affirmative determination in step 205), then a determination is made as to whether Pstring is empty (step 206). If Pstring is empty (affirmative determination in step 206), then code words representing the run-length sequence are output (step 207). In a preferred embodiment, the encoded run-length sequence comprises the predefined control code "1" (which is first output from the dictionary 15), followed by the code word for the character stored in C (which is also obtained from the dictionary), which is then followed by the number of consecutive characters that were found in the input stream to match the character in C.

On the other hand, if Pstring is not empty (negative determination in step 206) upon the triggering of run-length encoding process, before the run-length encoding sequence is generated and output (step 207), the code word having an entry (character string) that matches the current value of Pstring is output (step 208), and Pstring is set to empty (step 209). It is to be understood that the code word for the current value of Pstring in this instance would be the code word that was determined (and temporarily stored in Mcode) from a last successful dictionary search.

If there are not enough consecutively similar characters to trigger an run-length encoding sequence (negative determination in step 205), referring now to FIG. 2b, the character string Pstring+C is generated (step 210). A dictionary search is then performed to determine if there is an indexed character string that matches Pstring+C (step 211). This search is performed using, for example, the search techniques described above, e.g., searching each entry in the dictionary starting from index D[3] to find an entry that matches Pstring+C, or using the hash table to first determine each dictionary index having a character string entry that begins with the first character in the string Pstring+C. It is to be understood that, during the initial search, there is always a match found in the dictionary for Pstring+C because Pstring is empty and C contains a single character (i.e., in the illustrative embodiment, the dictionary is initialized to include all possible character codes ranging from 0 to 255).

If a match for Pstring+C is found in the dictionary (affirmative result in step 212), the dictionary index D[i] (code word) corresponding to the matching entry is stored in Mcode (step 213). Next, the string Pstring+C is stored in the Pstring data structure (step 214). Then, assuming there are additional bytes to process (affirmative result in step 202) and assuming a run-length encoding process is not triggered (step 205), the process (i.e., steps 210–214) is repeated until the current value of Pstring+C is not found in the dictionary (negative determination in step 212). It is to be appreciated that for each iteration of this process, as each input character C is added to the current string Pstring, a dictionary search is performed for the most current value Pstring+C and the value of Mcode is updated (but not output) to include the code word (dictionary index) of the current string Pstring+C if it is found in the dictionary.

When there is no match found between an indexed string in the dictionary and the current Pstring+C (negative determination in step 212), the code word stored in Mcode corresponding to the last successful dictionary search (in which a match for the current Pstring was found) is output (step 215). As explained above, the output code word may be further-processed using a bit-packing process as described above to provide additional compression.

Next, a dictionary entry is created for the new string Pstring+C (step 216) in anticipation of the new string being added to the dictionary. A determination is then made as to whether the addition of the new entry would exceed the predefined maximum number of entries for the dictionary (step 217). If the addition of the new entry would not result in exceeding this threshold (negative determination in step 217), the new entry will be added to the end of the dictionary (step 218), i.e., the entry will be indexed with the next available dictionary index. The appropriate hash table will then be updated (step 219), i.e., the new dictionary index will be added to the appropriate hash table array.

On the other hand, if the addition of the new entry would result in exceeding the maximum number of dictionary entries(affirmative determination in step 217), the dictionary will be reset to its initial state as described above (step 220). In addition, the hash table will be reset to reflect the initialization of the dictionary (step 221). Then, a predefined code word (e.g., code word "0") will be output to indicate that the dictionary has been reset (step 222). After initialization of the dictionary and hash table, the new entry will be added to the dictionary (step 218) and the appropriate hash table array will be updated to reflect the new entry (step 219).

In any event, once the new entry for Pstring+C has been added to the dictionary and the hash table has been updated appropriately, the Pstring data structure is set to include only the character in C (step 223). The dictionary is then searched for the string Pstring (step 224) and the index number of the matching string in stored in Mcode (step 225). It is to be understood that since Pstring contains one character C and since all possible characters are in the dictionary, the search is assured to find a match. Steps 224 and 225 are performed to ensure that if no match is found the during the next dictionary search, the code word (stored in step 225) corresponding to the match found in step 224 will be output.

Referring back to FIG. 2a, if there are more characters in the input stream, the process described above is repeated until it is determined that there are no more characters in the input stream (negative determination in step 202). Then, the code word (current value of Mcode) corresponding to a match for the current value of Pstring is output (step 226). Finally, a predefined control code word (e.g., code word "2") will be output to indicate the end of the encoding process (step 227).

The following example illustrates several iterations of a portion of the encoding process described above in FIGS. 2A and 2B. Assume the input stream comprises the following string of characters "a b a b c a . . . ", wherein each character comprises a byte of information. An initialization process is first performed as discussed above. Then, the first character a in the input stream is read and stored in the data structure C (step 203). The next character in the input stream b is checked to determine if it matches a (step 204). In this instance, it will be determined that there is no match and, consequently, a run-length encoding process is not triggered.

Accordingly, the string Pstring+C is created (step 210). Since Pstring is empty (due to initialization), the new string Pstring+C is simply a. The dictionary is searched for the new string. A matching entry for the character string a will be found since all possible one character strings are indexed in the dictionary. The index D[i] of the match is stored in Mcode (step 213). The string a (i.e., Pstring+C) is stored in Pstring data structure (step 214).

The next character in the input stream b is read and stored in the C data structure (step 203). The next character in the input stream a is checked to determine if it matches b(step 204). In this instance, it will be determined that there is no match and, consequently, a run-length encoding process is not triggered.

Accordingly, the string Pstring+C is created (step 210). Since Pstring contains the character a and C contains the character b, the new string is ab. The dictionary is searched for the new string (step 211). In this instance, a match will not be found since there is no entry in the dictionary for the string ab.

Since no match was found (negative result in step 212), the code word corresponding to the last match is output, i.e., the value in Mcode corresponding to the character a is output. Then, the string ab added to the dictionary at index D[259] (steps 216–218) (assuming of course that this is the first new entry after initialization of the dictionary and the addition would not exceed the maximum number of allowed entries).

Then, Pstring is set to include only the character in C, which is b (step 223), and the dictionary is searched for the indexed entry corresponding to a match for Pstring (step 224). Since, in this instance, Pstring contains only a single character b, a match is guaranteed. The index of the match is stored in Mcode (step 225).

Then, the next character in the input stream a is read and stored in the C data structure (step 203). The next character b is checked to determine if it matches a (step 204). In this instance, it will be determined that there is no match and, consequently, a run-length encoding process is not triggered.

Accordingly, the string ba (i.e., Pstring+C) is created (step 210). The dictionary is searched for the new string ba. A match will not be found since there is no entry for the string ba.

Since no match was found (negative result in step 212), the code word corresponding to the last match is output, i.e., the value in Mcode corresponding to the character b.

Then, the string ba added to the dictionary at index D[260] (steps 216–218) (assuming of course that this is the second new entry after initialization of the dictionary and the addition would not exceed the maximum number of allowed entries).

Then, Pstring is set to store the character in C, which is a (step 223) and the dictionary is searched for the indexed entry corresponding to a match for Pstring (step 224). Since, in this instance, Pstring contains only a single character a, a match is guaranteed. The index of the match is stored in Mcode (step 225).

Then, the next character in the input stream b is read and stored in the C data structure (step 203). The next character c is checked to determine if it matches b (step 204). In this instance, it will be determined that there is no match and, consequently, a run-length encoding process is not triggered.

Accordingly, the string ab (i.e., Pstring+C) is created (step 210). The dictionary is searched for the new string ab (step 211). In this instance, a match will be found since there was a previous entry added to the dictionary for the string ab. Accordingly, the code word (dictionary index) of the entry ab (which is this example is D[259]) is stored in Mcode (step 213). The new string ab is stored in Pstring (step 214).

The next character in the input stream c is read and stored in the C data structure (step 203). The next character in the input stream a is checked to determine if it matches c(step 204). In this instance, it will be determined that there is no match and, consequently, a run-length encoding process is not triggered.

Accordingly, the string abc (i.e., Pstring+C) is created (step 210). The dictionary is searched for the new string abc. A match will not be found since there is no entry for the string abc.

Since no match was found (negative result in step 212), the code word corresponding to the last match is output, i.e., the previously stored value in Mcode corresponding to the character string ab. Then, the string abc is added to the dictionary at index D[261] (steps 216–218) (assuming of course that this is the third new entry after initialization of the dictionary and the addition would not exceed the maximum number of allowed entries).

Then, Pstring is set to store the character in C, which is c (step 223) and the dictionary is searched for the indexed entry corresponding to a match for Pstring (step 224). Since Pstring contains only a single character c, a match is guaranteed. The index of the match is stored in Mcode (step 225). Again, this process is repeated for all characters in the input stream.

Data Decompression

Figure 3:
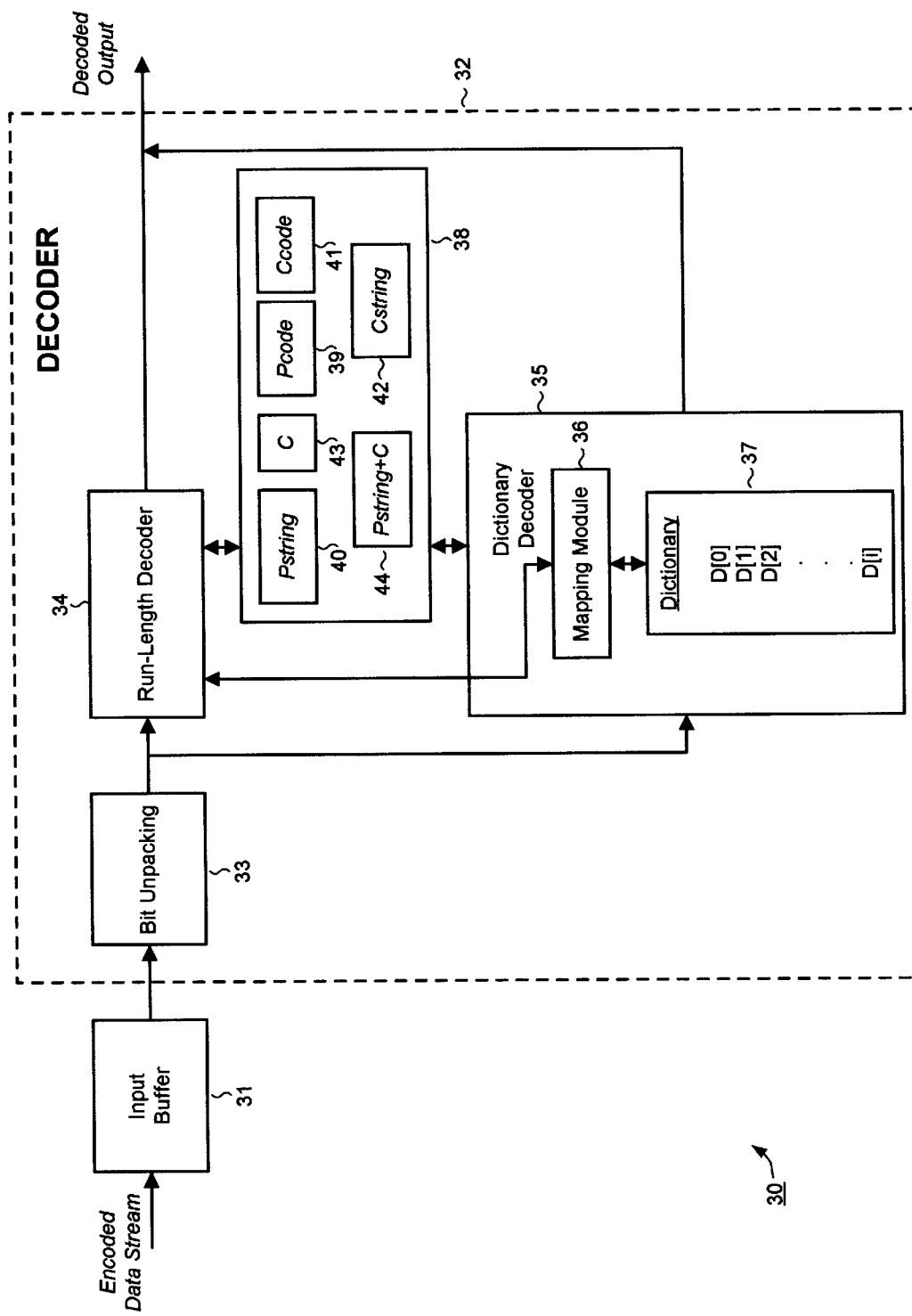
FIG. 3 is a block diagram of a system for providing lossless data decompression according to an embodiment of the present invention.

Referring now to FIG. 3, a block diagram illustrates a system 30 for providing lossless data decompression according to an embodiment of the present invention. In general, the data decompression system 30 comprises an input buffer 31 for temporarily buffering an encoded data stream and a decoder 32 for decompressing the encoded data stream. It is to be understood that the encoded data stream may be, e.g., received from a storage medium for decoding, or received at a desired location over a communication channel and decoded at the location. It is to be further understood that the input buffer 31 is an optional component that may be employed, for example, in real-time decompression applications where the rate of decompression of the decoder 32 is slower than the bandwidth of the transmitted encoded data stream.

In general, the decoder 32 performs, for the most part, the inverse of the encoding process described above. As an encoded data stream is received by the decoder 32, a bit unpacking module 33 unpacks the bits and restores the original code words generated by the encoder 12 (FIG. 1). Again, it is to be understood that the bit packing module 22 (FIG. 1) is an optional component that may be employed to provide additional compression of the code words. Therefore, if bit packing is not implemented for the encoding process, bit unpacking is not employed in the decoding process.

The decoder 32 comprises a run-length decoder 34 for processing encoded run-length sequences in the encoded data stream and outputting the decoded data corresponding to such encoded run-length sequences. As explained below, if the run-length decoder detects a control word "1" in the input data stream, it will read and process the next two successive words in the encoded stream to output the decoded data.

A dictionary decoder 35 is employed to build a dictionary 37 which is identical to the dictionary built by the encoder 12 (as discussed above). Using a mapping module 36 (or any suitable dictionary lookup function), the dictionary decoder will output character strings that are entries in the dictionary 37 to recreate the original file.

It is to be understood that the state of the dictionary of the encoder is always at least one step ahead of the state of the dictionary of the decoder. Therefore, it is possible that the encoder will output a code word for a unique data block string that the decoder has not yet entered in the decoding dictionary. This special case occurs when a character string is encoded using the string immediately preceding it. When this special situation occurs, the first and last characters of the string must be the same. Accordingly, when the decoder receives a code word that is not in the decoding dictionary, the decoder will know that the first character of the string that was encoded is equal to the last character. This a priori knowledge enables the decoder to handle this special case. It is to be appreciated that because there are no lengthy dictionary searches performed during the decoding process, it is much less computationally intensive than the encoding process. A decoding process according to one aspect of the present invention is described below with reference to FIGS. 4A and 4B.

The decoder 32 utilizes a plurality of data storage structures 38 for temporarily storing data during a decoding process. For example, in the illustrative embodiment of FIG. 3, a Pcode data structure 39 (or "Pcode") is used for temporarily storing a previous code word received by the decoder 32. A Pstring data structure 40 ("Pstring") is employed for temporarily storing a dictionary string corresponding to Pcode. A Ccode data structure 41 ("Ccode") is employed for temporarily storing a code word that is currently being processed. A Cstring data structure 42 ("Cstring") is employed for temporarily storing a dictionary string corresponding to Ccode. A C data structure 43 is employed for temporarily storing a next code word (byte) C in the encoded input stream. Finally, a Pstring+C data structure 44 is used for temporarily storing a character string Pstring+C which is a string comprising all of the characters in Pstring plus the character in C. The use of these data structures will be discussed in further detail below.

Figure 4A:
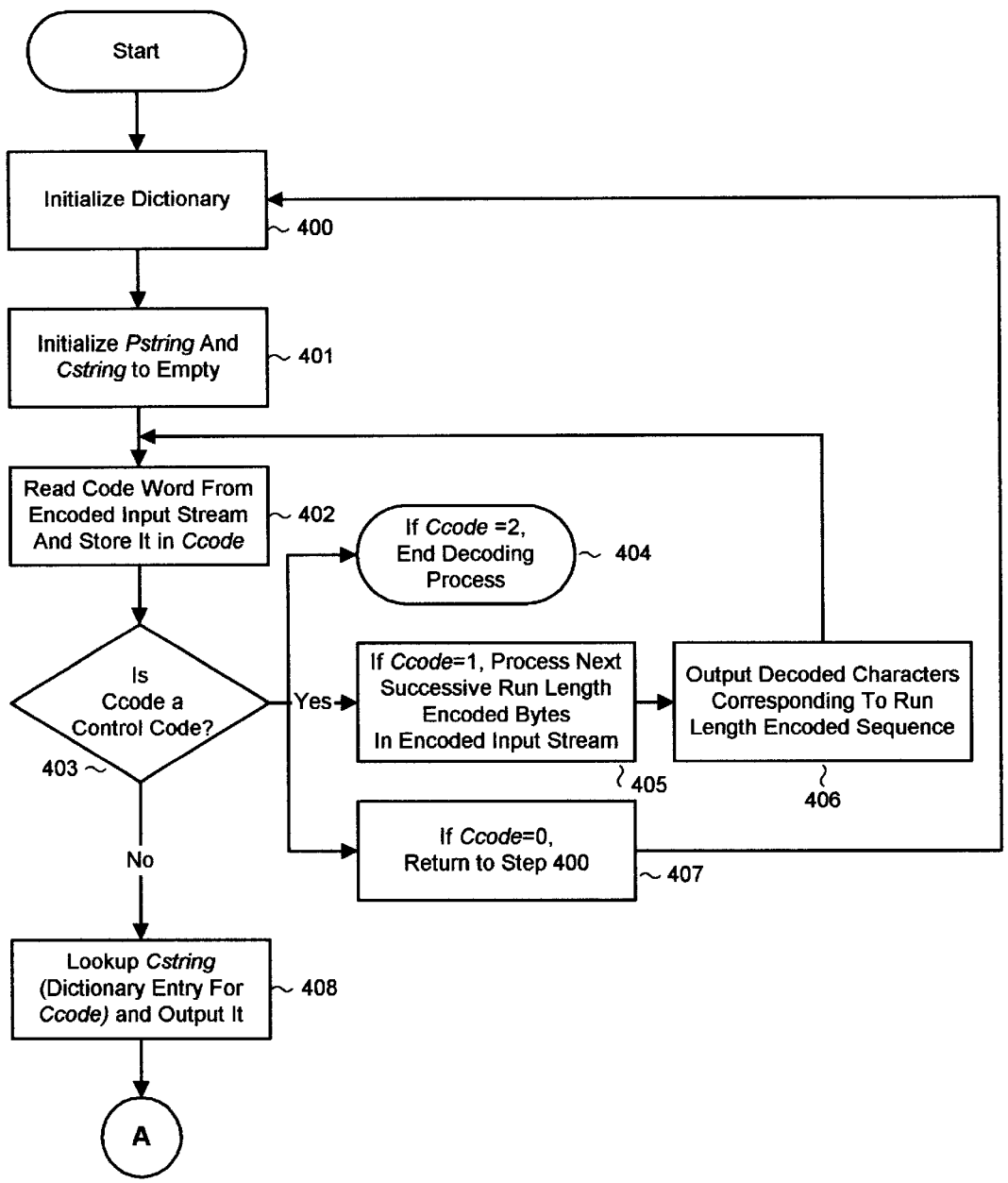
FIGS. 4A and 4B comprise a flow diagram of a method for providing lossless data decompression according to one aspect of the present invention.
Figure 4B:
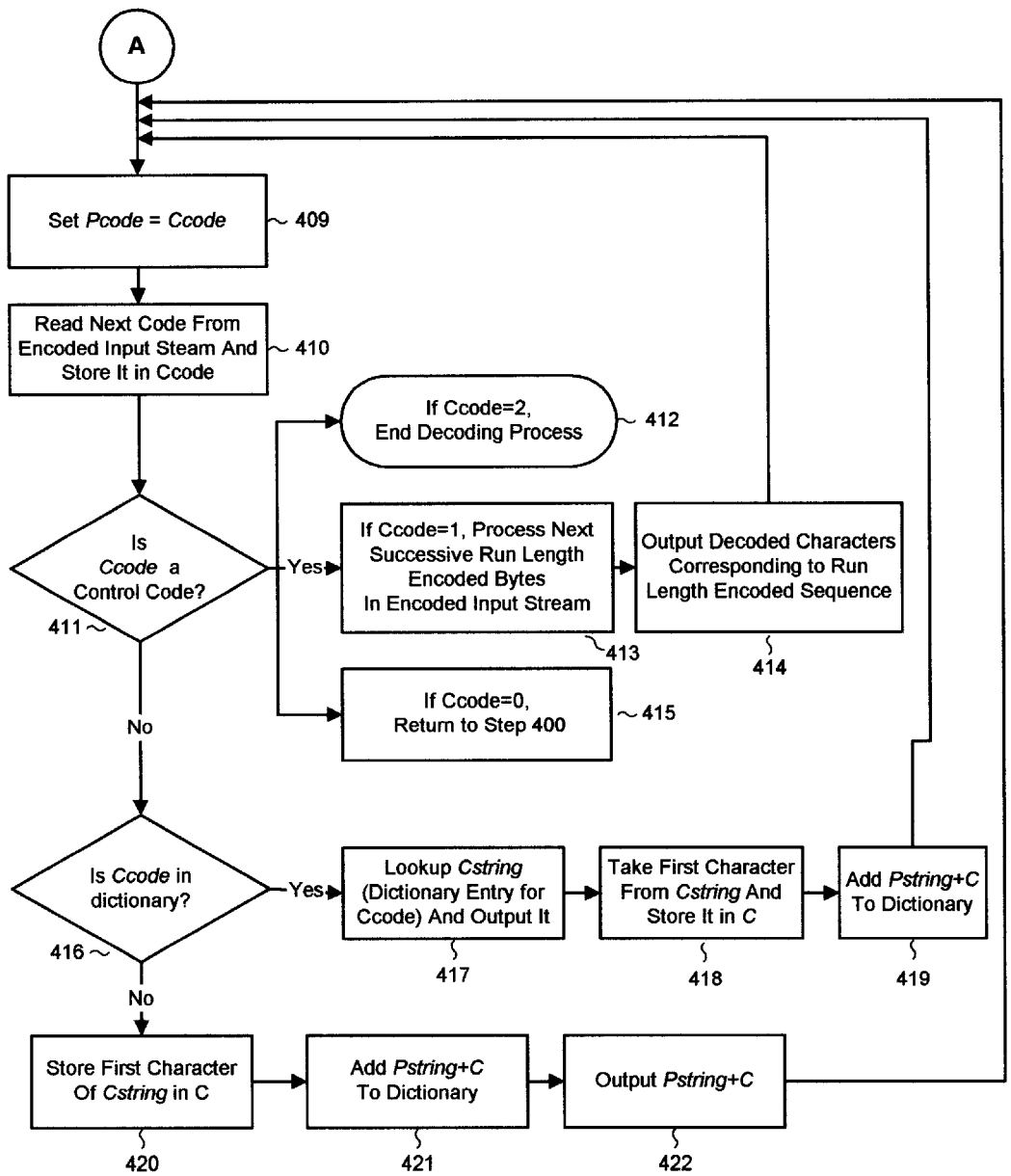

Referring now to FIGS. 4a and 4b, a flow diagram illustrates a method for decompressing data according to one aspect of the present invention. In particular, the decoding process depicted in FIGS. 4A and 4B illustrates a mode of operation of the system 30 of FIG. 3. Initially, the dictionary 37 will be initialized in the same manner as discussed above (step 400) i.e., the dictionary will comprises an index for each of the three control words and an index for each of the 256 characters). In addition, Pstring and Cstring are initialized to empty (step 401). It is to be understood that Pcode, Ccode, and C do not require initialization.

After initialization, the first code word in the encoded input stream will be read and stored in Ccode (step 402). A determination is then made as to whether the current code word (stored in Ccode) is a (predefined) control word (step 403). If Ccode is a control word (affirmative determination in step 403), the decoding process will be terminated if the control word is "2" (step 404). If the control word is "1", then a run-length decoding process is commenced by reading and processing the next two words in the encoded input stream (step 405). In particular, as explained above, a code word "1" is output during the encoding process to indicate that the next two consecutive output numbers (in the encoded sequence) represent a run-length encoding sequence comprising (1) a character code and (2) a number denoting the amount of consecutive characters found in the data stream corresponding to the character code. Accordingly, assuming "X" represents the character code and "N" represents the number of consecutive "X"s, the decoder will output the character X, N times (step 406). Finally, if the control word is "0" (step 407), the decoding process is initialized (return to step 400).

On the other hand, if the current Ccode does not comprise a control word (negative determination in step 403), the dictionary will be searched to find the string Cstring corresponding to the current Ccode (step 408). It is to be understood that the first (non-control) code word in the input stream will always be found in the dictionary, i.e., the first non-control word will correspond to one of the 256 code words that are initialized in the dictionary.

Referring now to FIG. 4B, Pcode is set to be equal to Ccode (step 409) (and the string Pstring is set based on the value of Pcode). The next code word will be read from the encoded input stream and stored in Ccode (step 410).

A determination is then made as to whether the current code word (stored in Ccode) is a (predefined) control word (step 411). As explained above, if Ccode is a control word (affirmative determination in step 411), the decoding process will be terminated if the control word is "2" (step 412). If the control word is "1", then a run-length decoding process is commenced by reading and processing the next two words ("X" and "N", respectively) in the encoded input stream (step 413) and the decoder will output the character X, N times (step 414). If the control word is "0" (step 415), the decoding process is initialized (return to step 400).

If, on the other hand, the current Ccode is not a control code (negative determination in step 411), a determination is made as to whether there is an indexed entry (Cstring) in the decoding dictionary corresponding to Ccode (step 416). If there is an entry (affirmative determination in step 416) then Cstring corresponding to that Ccode is output (step 417). Then, the first character of Cstring is stored in the C data structure (step 418). A new string Pstring+C is then formed and added to the decoding dictionary (step 419).

If there is no entry in the dictionary for the current Ccode (negative determination in step 416) this is the special case described above and the decoder performs the following steps. First, the first character from Pstring is stored in the C data structure (step 420). Then, a new string Pstring+C is formed and added to the decoding dictionary (step 421). The new string Pstring+C is then output by the decoder (step 422).

The following example illustrates several iterations of the decoding process using the output from the above encoding example which was based on the input string "a b a b c a . . ." The data structure are initialized as described above (steps 400 and 401). The first code is read and stored in the data structure Ccode. Since the first input code corresponds to character a, the current Ccode is determined not to be a control code (step 403). Accordingly, the dictionary entry Cstring (i.e., a) corresponding to Ccode is output.

Pcode is then set equal to Ccode (step 409). The next code word is read and stored in the data structure Ccode. Since the code word corresponds to character b, Ccode is not a control code (step 411). The decoding dictionary is then searched for a match for Ccode (step 416). Since a single character string (i.e., b in this instance) is always in the dictionary, a match will be found. Since a match is guaranteed, the dictionary entry Cstring (i.e., b) is output (step 417). Next, the first character of Cstring (i.e.,b) is stored in C (step 418). A new string Pstring+C is formed and added to the dictionary (step 419). In this example, since Pstring is the string corresponding to Pcode, which is the character a, and C contains the character b, the new string Pstring+C is ab, which is added to the dictionary at the next available index, D[259]. Again, Pcode is set equal to Ccode.

Then, the next code word (corresponding to character ab) is read and stored in the data structure Ccode. Since this is not a control code, the dictionary is searched for a match for Ccode. Again, in this instance, there will be a match. Accordingly, Cstring, i.e., ab, is output.

Then, the first character of Cstring (which is a) is stored in C (step 418). A new string Pstring+C is formed comprising ba (i.e., Pstring is the string corresponding to Pcode, b, and C contains a) and then added to the dictionary (step 419) at, the next available index D[260]. Then, Pcode is set equal to Ccode, and the process is repeated.

It is to be appreciated the present invention exploits various traits within run-length encoding, parametric dictionary encoding, and bit packing to provide an encoding/decoding process whose efficiency is suitable for use in real-time lossless data compression and decompression systems such as the systems disclosed in U.S. patent application Ser. No. 09/210,491, filed on Dec. 11, 1998, entitled "Content Independent Data Compression Method and System," which is commonly assigned and fully incorporated herein by reference.

In particular, although dictionary class encoding techniques, in general, are considered superior to run-length encoding techniques, run-length encoding techniques can process and compress contiguous strings of data blocks far more optimally than dictionary encoding techniques. We have analyzed the manner in which certain programs store data. By way of example, we have determined that MICROSOFT OFFICE™ applications use large string of repetitive characters in certain portions of programs and data files such as in the headers and footers of the files, although these run-lengths can occur in the middle of files such as .dll files, data base files and those files with embedded data structures.

Using an analysis tool that analyzes the frequency of characters (i.e., a histogram analysis of the frequency (count) of byte values), we have found that .exe files and .doc files comprise an inordinate quantity of bytes that are equal to 00hex (0s) and FFhex (255). These frequently occurring byte values often appear in contiguous strings as header, footer or byte padding values for data structures internal to the Word format. As indicated above, a run-length algorithm exploits these occurrences far more optimally than any known dictionary technique.

In addition, a further analysis of these file types on a block basis, e.g., an 8 kilobyte block or 4 kilobyte block, underscores the advantage of using a combination of dictionary and run-length encoding—the contiguous nature of the data strings that we have found in these files amplifies the benefit of the run-length encoding over the dictionary encoding since the dictionary encoding has been determined to typically provide a lower compression ratio when applied to smaller quantities of data. Therefore, while dictionary compression techniques typically yield higher compression ratios than run-length, this may not be true, e.g., for most MICROSOFT WINDOWS™ operating system, program and data files. Accordingly, an encoding process such as described herein using a combination of run-length and dictionary encoding is far superior to compress data files, etc., that characteristically include contiguous strings of similar data blocks.

Moreover, as indicated above, the use of bit-packing in combination with the dictionary and run-length encoding advantageously provides additional compression, with a negligible increase in the overhead or processing time required for the bit-packing.

Further, the parametric nature of the algorithm allows for tailoring to a wide variety of applications and target processing architectures, wherein trades in processor throughput and instruction set mix, memory hierarchy and bandwidth, and requisite input/output bandwidth requirements may be accommodated. By way of example, various memory bandwidths and sizes within the processing hierarchy may dictate the size of the dictionary in terms of the number of entries (or "dictionary depth"), and maximum length of each entry (or "dictionary width"). For example, the Texas Instruments Digital Signal Processor TMS320C6x and TMS320C5x employ separate onboard caches for program and data memory in a Harvard Architecture Arrangement. The caching may further have multiple levels of cached commonly known as L1 (lowest level) and L2 (higher level) onboard cache. Typically the lowest levels of cache have highest throughput. Also, caches are typically faster that external memory.

In one aspect of the present invention, by fixing the dictionary depth to place it in the appropriate level of caching, one can obtain a desired balance between the compression ratio and compression throughput. Indeed, although a larger dictionary typically produces a higher compression ratio, the larger dictionary results in slower throughput. With the current technology limit, L1 cache is typically too small to store a full dictionary and the dictionary is maintained at its optimum size in L2 cache. However, this trade is specific to the desired compression ratio and throughput.

In another aspect of the present invention, the throughput of, e.g., the encoding process can be monitored as a function of compression ratio and dictionary size. If the compression throughput is found to fall below a desired level or is otherwise desired to be increased the compression algorithm may dynamically enlarge the dictionary to increase compression ratio or decrease the dictionary to improve throughput. It should be noted that the relationship is dependent upon the entropy content of the input data stream and may be multivalued and/or non-linear. In yet another aspect of the present invention, a learning algorithm may be further applied to learn the optimum ratios using a time weighted average of throughput.

Another approach is to page dictionary entries from memory to L2 cache, L2 cache to L1 cache, or L1 cache to on board registers within the processor. This methodology can be extended to any memory hierarchy within a single or multiprocessor architecture.

In another embodiment, the present invention may adopt the use of a control signal that would affect the compression technique used by the encoder. The control signal could originate from the same source as the data. It would indicate to the encoder whether to place emphasis on the compression speed or the compression ratio during the encoding process. As indicated above, when it comes to compression speed and compression ratio, one can often be sacrificed to benefit the other.

An example of the use of such a control signal is as follows. Assume the encoder resides in a hard disk controller of a computer. The operating system driver that sends the information to be stored on the disk would generate the control signal. The driver may use an algorithm that normally sends a control signal to the encoder indicating that the encoder should use a form of the compression process that yields a very high compression ratio even if the encoding process is not very fast. When the driver has accumulated sufficient amount of data to be written to the disk, then the driver could generate a control signal to the encoder which would cause the controller to use a very fast implementation of its compression algorithm, even if it does not produce the best compression ratio.

In a particular example, the use of a control signal may be employed to set the appropriate parameters within the encoding/decoding algorithms described herein to facilitate data storage and retrieval bandwidth acceleration and provide data compression and decompression at rates faster than the input data stream such as disclosed in U.S. patent Ser. No. 09/266,394, filed on Mar. 11, 1999, entitled "System and Methods For Accelerated Data Storage and Retrieval," which is commonly assigned and fully incorporated herein by reference. For example, if a data stream inputs 30 megabytes per second the losslessly compressed, real-time, output stream is 10 megabytes per second, assuming a 3:1 compression ratio. Conversely, if a compressed input data stream is 10 megabytes per second, the corresponding decompressed, real-time output stream is 30 megabytes per second, again assuming an original 3:1 lossless compression ratio. Again, using the methods described above, the accelerated data storage and retrieval rates may be modified based on the desired compression and throughput.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for compressing input data comprising a plurality of data blocks, the method comprising the steps of:

detecting if the input data comprises a run-length sequence of data blocks;

outputting an encoded run-length sequence, if a run-length sequence of data blocks is detected;

maintaining a dictionary comprising a plurality of code words, wherein each code word in the dictionary is associated with a unique data block string;

building a data block string from at least one data block in the input data that is not part of a run-length sequence;

searching for a code word in the dictionary having a unique data block string associated therewith that matches the built data block string; and outputting the code word representing the built data block string.

2. The method of claim 1, wherein the step of detecting a run-length sequence comprises the steps of:

receiving an input data block;

identifying a run-length sequence if at least the next s successive data blocks in the input data are similar to the input data block.

3. The method of claim 2, wherein the step of outputting an encoded run-length sequence comprises the step of consecutively outputting a first control code word indicating a run-length sequence, a code word in the dictionary having a unique data block string associated therewith that corresponds to the input data block, and a word corresponding to the number of successive data blocks that are similar to the input data block.

4. The method of claim 1, wherein the step of maintaining a dictionary comprises the steps of:

dynamically generating a new code word corresponding to a built data block string, if the built data block string does not match a unique data block string in the dictionary; and adding the new code word in the dictionary.

5. The method of claim 4, wherein the step of maintaining the dictionary further comprises the step of initializing the dictionary if the number of code words exceeds a predetermined threshold.

6. The method of claim 5, wherein the step of initializing the dictionary comprises the steps of:

resetting the dictionary to include all possible code words corresponding to a unique data block string comprising a single data block; and outputting a control code word indicating that the dictionary has been initialized.

7. The method of claim 1, wherein the code words in the dictionary further comprises at least one control code word representing one of dictionary initialization, a run-length encoded sequence, an end of the input data, and a combination thereof.

8. The method of claim 1, wherein each code word in the dictionary comprises a dictionary index.

9. The method of claim 1, further comprising the step of bit-packing encoded run-length sequences and code words that are output.

10. The method of claim 1, wherein the step of building a data block string comprises the steps of:

(a) iteratively storing in a first data structure, a next successive data block in the input data to build a current data block string; and (b) for each iteration in step (a), updating a previous code word stored in a second data structure to a current code word corresponding to the current data block string in the first data structure, if the code word for the current data block string in the first data structure is found in the dictionary; and further wherein the step of outputting the code word representing the built data block string comprises the steps of outputting the previous code word stored in the second data structure, if a code word is not found in the dictionary corresponding to the current data block string in the first data structure.

11. The method of claim 10, further comprising the step of adding the current data block string to the dictionary.

12. The method of claim 11, further comprising the steps of:

storing, in a third data structure, the last data block input in the first data structure, if the current data block string is not found in the dictionary; and repeating steps (a) and (b) starting with the data block in the third data structure, if the data block in the third data structure is not part of a run-length sequence.

13. The method of claim 1, further comprising the step of maintaining a hash table comprising a plurality of arrays, wherein each array comprises all code words in the dictionary that are associated with a unique data block having a first data block whose value corresponds with an index of the array, and wherein the hash table is used for the step of searching for a code word in the dictionary.

14. A program storage device readable by a machine, tangibly embodying a program of instructions executable by the machine to perform method steps for compressing input data comprising a plurality of data blocks, the method comprising the steps of:

detecting if the input data comprises a run-length sequence of data blocks;

outputting an encoded run-length sequence, if a run-length sequence of data blocks is detected;

maintaining a dictionary comprising a plurality of code words, wherein each code word in the dictionary is associated with a unique data block string;

building a data block string from at least one data block in the input data that is not part of a run-length sequence;

searching for a code word in the dictionary having a unique data block string associated therewith that matches the built data block string; and outputting the code word representing the built data block string.

15. The program storage device of claim 14, wherein the instructions for performing the step of detecting a run-length sequence comprise instructions for performing the steps of:

receiving an input data block;

identifying a run-length sequence if at least the next s successive data blocks in the input data are-similar to the input data block.

16. The program storage device of claim 15, wherein the instructions for performing the step of outputting an encoded run-length sequence comprise instructions for performing the step of consecutively outputting a first control code word indicating a run-length sequence, a code word in the dictionary having a unique data block string associated therewith that corresponds to the input data block, and a word corresponding to the number of successive data blocks that are similar to the input data block.

17. The program storage device of claim 14, wherein the instructions for performing the step of maintaining a dictionary comprise instructions for performing the steps of:

dynamically generating a new code word corresponding to a built data block string, if the built data block string does not match a unique data block string in the dictionary; and adding the new code word in the dictionary.

18. The program storage device of claim 17, wherein the instructions for performing the step of maintaining the dictionary comprise instructions for performing the step of initializing the dictionary if the number of code words exceeds a predetermined threshold.

19. The program storage device of claim 18, wherein the instructions for performing the step of initializing the dictionary comprise instructions for performing the steps of:

resetting the dictionary to include all possible code words corresponding to a unique data block string comprising a single data block; and outputting a control code word indicating that the dictionary has been initialized.

20. The program storage device of claim 14, wherein the code words in the dictionary further comprise at least one control code word representing one of dictionary initialization, a run-length encoded sequence, an end of the input data, and a combination thereof.

21. The program storage device of claim 14, wherein each code word in the dictionary comprises a dictionary index.

22. The program storage device of claim 14, further comprising instructions for performing the step of bit-packing encoded run-length sequences and code words that are output.

23. The program storage device of claim 14, wherein the instructions for performing the step of building a data block string comprise instructions for performing the steps of:
  (a) iteratively storing in a first data structure, a next successive data block in the input data to build a current data block string; and
  (b) for each iteration in step (a), updating a previous code word stored in a second data structure to a current code word corresponding to the current data block string in the first data structure, if the code word for the current data block string in the first data structure is found in the dictionary; and
  further wherein the instructions for performing the step of outputting the code word representing the built data block string comprise instructions for performing the step of outputting the previous code word stored in the second data structure, if a code word is not found in the dictionary corresponding to the current data block string in the first data structure.

24. The program storage device of claim 23, further comprising instructions for performing the step of adding the current data block string to the dictionary.

25. The program storage device of claim 24, further comprising instructions for performing the steps of:
  storing, in a third data structure, the last data block input in the first data structure, if the current data block string is not found in the dictionary; and
  repeating steps (a) and (b) starting with the data block in the third data structure, if the data block in the third data structure is not part of a run-length sequence.

26. The program storage device of claim 14, further comprising instructions for performing the step of maintaining a hash table comprising a plurality of arrays, wherein each array comprises all code words in the dictionary that are associated with a unique data block having a first data block whose value corresponds with an index of the array, and wherein the hash table is used for the step of searching for a code word in the dictionary.

27. A method for decompressing an encoded data stream comprising a plurality of code words, the method comprising the steps of:
  maintaining a dictionary comprising a plurality of code words utilized to generate the encoded data stream, wherein the code words in the dictionary comprise control code words and code words that are each associated with a unique data block string;
  decoding and outputting a run-length sequence of data blocks associated with an input code word of the encoded data stream, if the input code word is a control code word in the dictionary that indicates an encoded run-length sequence;
  outputting a unique data block string in the dictionary that is associated with an input code word of the encoded data stream, if the input code word is found in the dictionary; and
  if the input code word is not found in the dictionary, building a new data block string comprising (1) the unique data block string associated with a previous control word found in the dictionary and (2) the first data block of the unique data block string, adding the new string to the dictionary and outputting the new string.

28. A system for compressing input data comprising a plurality of data blocks, the system comprising:
  a dictionary comprising a plurality of code words, wherein the code words comprise control code words and code words that are each mapped to a unique data block string;
  a run-length encoder for encoding a sequence of similar data blocks in the input data using at least one code word in the dictionary; and
  a dictionary encoder for encoding a data block string comprising at least one data block in the input data using a code word in the dictionary, wherein output of the run-length encoder and dictionary encoder are combined to form an encoded data stream.

29. The system of claim 28, further comprising a system for decompressing the encoded data stream, wherein the system for decompressing the encoded data stream comprises:
  a dictionary comprising a plurality of code words utilized to generate the encoded data stream, wherein the code words in the dictionary comprise control code words and code words that are each associated with a unique data block string;
  a run-length decoder for decoding and outputting a run-length sequence of data blocks associated with an input code word of the encoded data stream, if the input code word is a control code word in the dictionary that indicates an encoded run-length sequence;
  a dictionary decoder for outputting a unique data block string in the dictionary that is associated with an input code word of the encoded data stream, if the input code word is found in the dictionary; and if the input code word is not found in the dictionary, building a new data block string comprising (1) the unique data block string associated with a previous control word found in the dictionary and (2) the first data block of the unique data block string, adding the new string to the dictionary and outputting the new string.

30. The system of claim 29, wherein the compression and decompression systems are employed for accelerated data storage and retrieval.

* * * * *